(12) United States Patent
Yoshida et al.

(10) Patent No.: US 10,490,144 B2
(45) Date of Patent: Nov. 26, 2019

(54) TFT CIRCUIT AND SHIFT REGISTER CIRCUIT

(71) Applicant: SHARP KABUSHIKI KAISHA, Sakai, Osaka (JP)

(72) Inventors: Tokuo Yoshida, Sakai (JP); Takuya Watanabe, Sakai (JP); Akira Tagawa, Sakai (JP); Yasuaki Iwase, Sakai (JP); Yohei Takeuchi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/309,386

(22) PCT Filed: Jun. 29, 2017

(86) PCT No.: PCT/JP2017/023992
§ 371 (c)(1),
(2) Date: Dec. 12, 2018

(87) PCT Pub. No.: WO2018/003931
PCT Pub. Date: Jan. 4, 2018

(65) Prior Publication Data
US 2019/0164509 A1 May 30, 2019

(30) Foreign Application Priority Data
Jul. 1, 2016 (JP) .................................. 2016-131398

(51) Int. Cl.
*G09G 3/36* (2006.01)
*G11C 19/28* (2006.01)
*G09G 3/20* (2006.01)

(52) U.S. Cl.
CPC ................. *G09G 3/36* (2013.01); *G09G 3/20* (2013.01); *G09G 3/3677* (2013.01);
(Continued)

(58) Field of Classification Search
CPC .............................. G11C 19/28; G09G 3/3677
See application file for complete search history.

(56) References Cited

U.S. PATENT DOCUMENTS 9,177,666 B2 * 11/2015 Wu .......................... G11C 19/28
9,508,450 B2 * 11/2016 Qing .................... G11C 19/184
(Continued)

FOREIGN PATENT DOCUMENTS

JP 2015-060100 A 3/2015

*Primary Examiner* — Patrick O Neill
(74) *Attorney, Agent, or Firm* — ScienBiziP, P.C.

(57) ABSTRACT

A TFT circuit (101) includes a first node (N1) to which a first low potential (Vc) is supplied, a depression-type first TFT (21) which is arranged between the first node (N1) and low-potential wiring (11) for supplying a second low potential (Va) higher than the first low potential (Vc), and in which a drain terminal is connected to the first node, and a depression-type second TFT (22) which is arranged between the first TFT (21) and the low potential wiring (11) and in which a source terminal is connected to a source terminal of the first TFT, in which the first low potential (Vc) is supplied to a gate terminal of the second TFT, a second node (N2) enterable a floating state is formed between the source terminal of the first TFT and the source terminal of the second TFT, and the second node (N2) is connected to a sub-circuit (SC1) which is settable a potential of the second node (N2) to be lower than the second low potential (Va) and higher than the first low potential (Vc).

9 Claims, 10 Drawing Sheets

(52) U.S. Cl.
CPC ............... *G09G 2300/0408* (2013.01); *G09G 2310/0286* (2013.01); *G11C 19/28* (2013.01)

(56) References Cited

U.S. PATENT DOCUMENTS

| | | | |
|---|---|---|---|
| 2013/0038583 A1* | 2/2013 | Shimada ................ | G11C 19/28 345/204 |
| 2014/0064439 A1* | 3/2014 | Qing ...................... | G11C 19/28 377/75 |
| 2015/0171833 A1* | 6/2015 | Pi .......................... | H03K 3/012 327/109 |

* cited by examiner (a) RELATED ART (b) RELATED ART (a)

TFT CIRCUIT AND SHIFT REGISTER CIRCUIT

TECHNICAL FIELD

The present invention relates to a TFT circuit, which includes a depression-type thin film transistor, and a shift register circuit.

BACKGROUND ART

An active matrix substrate used for a liquid crystal display apparatus or the like is provided with a switching element such as a thin film transistor (hereinafter "TFT") for each pixel. As such a switching element, TFT having an amorphous silicon film as an active layer (hereinafter, "amorphous silicon TFT") and a TFT having a polycrystalline silicon film as an active layer (hereinafter, "polycrystalline silicon TFT") are widely used in the related art.

In recent years, use of an oxide semiconductor instead of amorphous silicon or polycrystalline silicon as a material for an active layer of a TFT has been proposed. Such TFTs are referred to as "oxide semiconductor TFTs". Oxide semiconductors have higher mobility than amorphous silicon. Therefore, oxide semiconductor TFTs are able to operate at a higher speed than amorphous silicon TFTs. In addition, in oxide semiconductor TFTs, rising of Id-Vg characteristic is steep and an off leak current is small since the oxide semiconductors have the higher mobility.

Meanwhile, techniques are known in which a drive circuit such as a gate driver or a source driver is monolithically (integrally) provided on a substrate (for example, refer to PTL 1). These drive circuits (monolithic drivers) are usually formed using TFTs. Recently, a technique of manufacturing a monolithic driver on a substrate using an oxide semiconductor TFT has been used which allows a reduction in costs to be realized by narrowing a pixel-frame region and simplifying a mounting process.

Generally, TFTs forming a drive circuit (hereinafter referred to as "circuit TFTs") are manufactured in a step of manufacturing a TFT arranged as a switching element for each pixel (hereinafter referred to as "pixel TFTs") at a same time. Therefore, the circuit TFTs and the pixel TFTs are formed using a same oxide semiconductor film and often have a same or a similar structure. Usually, an enhancement-type TFT having a positive threshold voltage Vth is used as the pixel TFT and the circuit TFT.

Even display units of active matrix type liquid crystal display apparatuses using an active matrix substrate may not be immediately cleared when a user turns off power supply and whitish and blurry images may remain thereon. The reason for this is that when the power supply of the apparatus is turned off, a discharge path of charges held in a pixel capacitor is interrupted and a residual charge is accumulated in a pixel region. In addition, when the power supply of the apparatus is turned on in a state where the residual charge is accumulated in the pixel region, deterioration of a display quality, such as generation of flickering based on the residual charge, occurs.

In a liquid crystal panel monolithically provided with a gate driver (hereinafter referred to as a "gate driver monolithic panel"), in addition to charges in a display region and charges of a gate bus line, it is also necessary to discharge charges on a floating node in a monolithic gate driver (the charges on the two floating nodes indicated by reference symbols netA and netE described below). In the monolithic gate driver using an a-Si TFT, since the off-leak current of the a-Si TFT is relatively large, the charges on the floating nodes in the monolithic gate driver (which may be hereinafter referred to as "floating charges") are able to be discharged in approximately three milliseconds. However, in a monolithic gate driver using an oxide semiconductor TFT having a small off-leak current, it is difficult to promptly discharge floating charges and there is a possibility that it will not be possible to sufficiently suppress charge unevenness caused by the floating charges.

On the other hand, the present inventors found that using a depression-type oxide semiconductor TFT having a negative threshold voltage Vth makes it possible to reduce an amount of charge which is accumulated in the display region and in drive circuits such as a monolithic gate driver.

FIG. 12 is a diagram illustrating current and voltage characteristics of an enhancement-type oxide semiconductor TFT and a depression-type oxide semiconductor TFT. The horizontal axis represents a gate voltage Vgs based on a source and the vertical axis represents a drain current Ids. In the enhancement-type TFT, a threshold voltage Vth is positive (Vth>0(V)), and the leakage current Ids is suppressed to be small when the gate voltage Vgs is 0 V. In this example, the leakage current Ids is approximately 4 pA. On the other hand, in the depression-type TFT, the threshold voltage Vth is negative (Vth<0(V)), and the leakage current. Ids when the gate voltage Vgs is 0 V is greater than that of the enhancement-type TFT. In this example, the leakage current Ids is approximately 260 nA. As above, in the depression-type oxide semiconductor TFT, it is possible to increase the leakage current when the gate voltage Vgs is 0 V (hereinafter, the leakage current which is generated when the gate voltage Vgs is 0 (V) is represented as "$Ids_{(Vgs=0)}$". Therefore, it is considered that, when a depression-type oxide semiconductor TFT is used, it is possible to rapidly discharge floating charges in a display region and in a drive circuit via the oxide semiconductor TFT, and to suppress gate bus line defects, charge unevenness, and the like caused by the floating charges.

CITATION LIST

Patent Literature

PTL 1: Japanese Unexamined Patent Application Publication No. 2015-60100

SUMMARY OF INVENTION

Technical Problem

However, according to investigations by the present inventors, there is the following problem in cases of forming a drive circuit using a depression-type TFT. A description will be given below of a depression-type n channel TFT as an example.

In order to strictly turn the depression-type TFT to an OFF state, the gate potential of the TFT needs to be lower than the source potential (Vgs<0(V)). However, according to the circuit configurations in the related art, in some depression-type TFTs, the gate potential and the source potential become the same potential (Vgs=0(V)), and the leakage current $Ids_{(Vgs=0)}$ flows. As a result, there is a concern that a gate output defect may occur.

Even if a TFT other than an oxide semiconductor TFT (for example, a silicon TFT) is used as the depression-type TFT, there is a problem similar to the above. Furthermore, without being limited to drive circuits, when a depression-type TFT is used in various circuits including TFTs (referred to as a "TFT circuit"), output characteristics may deteriorate due to the leakage current $Ids_{(Vgs=0)}$.

For example, PTL 1 proposes a configuration for a drive circuit which has an enhancement-type oxide semiconductor TFT which is able to suppress leakage current as a result of resistance of the oxide semiconductor layer being lowered by the introduction of hydrogen gas or the like, even in a case where the oxide semiconductor TFT operates as a depression-type TFT. However, it is not possible to apply the configuration proposed in PTL 1 to some TFTs among TFTs forming drive circuits.

The embodiments of the present invention are made in view of the circumstances described above and an object thereof is to suppress deterioration of output characteristics in a TFT circuit having a depression-type TFT caused by leakage current of the depression-type TFT.

Solution to Problem

A TFT circuit according to an embodiment of the present invention includes a first node to which a first low potential Vc is supplied, and a depression-type first TFT which is arranged between the first node and low-potential wiring for supplying a second low potential Va higher than the first low potential Vc, and in which a drain terminal is connected to the first node, in which the TFT circuit further includes a depression-type second TFT which is arranged between the first TFT and the low-potential wiring and in which a source terminal is connected to a source terminal of the first TFT, the first low potential Vc is supplied to a gate terminal of the second TFT, a second node enterable a floating state is formed between the source terminal of the first TFT and the source terminal of the second TFT, and the second node is connected to a sub-circuit which is gettable a potential of the second node to be lower than the second low potential Va and higher than the first low potential Vc.

In the embodiment, the sub-circuit includes the second TFT and a depression-type third TFT, a source terminal of the third TFT is connected to the second node, the first low potential Vc is supplied to a gate terminal of the third TFT, and a drain terminal of the third TFT is connected to other low-potential wiring which supplies the first low potential Vc.

In the embodiment, the sub-circuit supplies a third low potential Vb which is lower than the second low potential Va and higher than the first low potential Vc to the second node, thereby the potential of the second node being set to be lower than the third low potential Vb and higher than the first low potential Vc.

In the embodiment, the TFT circuit further includes a first push-down circuit for pushing down the potential of the second node n times using a plurality of signals to be input to the TFT circuit, and a second push-down circuit for pushing down a potential of the gate terminal of the second TFT m times, which is more than n times, using a plurality of signals to be input to the TFT circuit, in which the sub-circuit includes the first push-down circuit.

In the embodiment, the TFT circuit is a bistable circuit forming a shift register, including an output terminal for outputting an output signal, an output transistor in which a source or drain terminal is connected to the output terminal, a node netA connected to a gate terminal of the output transistor, a pull-down transistor for lowering a potential of the node netA, and a node netB connected to a gate terminal of the pull-down transistor, in which the first node is the node netA and the first TFT is the pull-down transistor.

In the embodiment, the TFT circuit is a bistable circuit forming a shift register, including an output terminal for outputting an output signal, an output transistor in which a source or drain terminal is connected to the output terminal, a node netA connected to a gate terminal of the output transistor, a pull-down transistor for lowering a potential of the node netA, and a node netB connected to a gate terminal of the pull-down transistor, in which the first node is the node netB.

In the embodiment, the TFT circuit is a bistable circuit forming a shift register, including an output terminal for outputting an output signal, a node GOUT connected to the output terminal, an output transistor in which a source or drain terminal is connected to the output terminal, a node netA connected to a gate terminal of the output transistor, a pull-down transistor for lowering a potential of the node netA, and a node netB connected to a gate terminal of the pull-down transistor, in which the first node is the node GOUT.

In the embodiment, the first TFT and the second TFT are oxide semiconductor TFTs.

A shift register circuit according to another embodiment of the present invention includes any one of the TFT circuits described above.

Advantageous Effects of Invention

According to an embodiment of the present invention, it is possible to suppress, in a TFT circuit having a depression-type TFT, the deterioration of output characteristics caused by leakage current of the depression-type TFT.

DESCRIPTION OF EMBODIMENTS

First Embodiment

A description will be given of a first embodiment of a TFT circuit according to the present invention with reference to the drawings. It is only necessary that the TFT circuit of the present embodiment includes a plurality of depression-type TFTs and the TFT circuit of the present embodiment may be a drive circuit such as a gate driver. All of the TFTs included in the TFT circuit may be depression-type or only some of the TFTs may be depression-type. A description will be given below of a TFT circuit using an n-channel TFT as a depression-type TFT.

Figure 1:
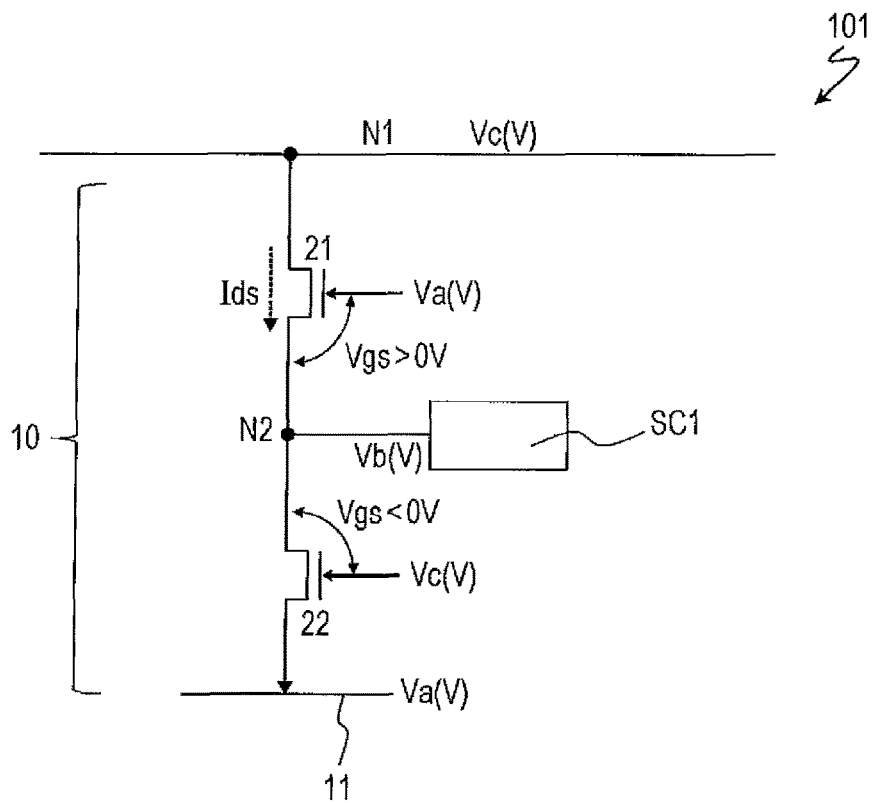
FIG. 1 is a diagram illustrating part of a TFT circuit of a first embodiment.

FIG. 1 is a diagram schematically illustrating part of the TFT circuit of the present embodiment.

The TFT circuit 101 has a first node N1 to which a first low potential Vc is supplied, a depression-type first TFT 21 arranged between the first node N1 and low-potential wiring 11, and a depression-type second TFT 22 arranged between the first TFT 21 and the low-potential wiring 11. The low-potential wiring 11 is wiring for supplying a second low potential Va higher than the first low potential Vc and may be power supply wiring.

A drain terminal of the first TFT 21 is connected to the first node N1. A source terminal of the first TFT 21 is connected to a source terminal of the second TFT 22 and is connected to the low-potential wiring 11 via the second TFT 22. For example, the second low potential Va is supplied to the gate terminal of the first TFT 21. Meanwhile, the source terminal of the second TFT 22 is connected to the source terminal of the first TFT 21, while a drain terminal of the second TFT 22 is connected to the low-potential wiring 11. For example, the first low potential Vc is supplied to a gate terminal of the second TFT 22.

A second node N2 which is able to enter a floating state is formed between the source terminal of the first TFT 21 and the source terminal of the second TFT 22. The second node N2 is connected to a sub-circuit SC1. The sub-circuit SC1 is a circuit which is able to make the potential of the second node N2 higher than the first low potential Vc and lower than the second low potential Va. As will be described below, the sub-circuit SC1 may include the second TFT 22.

The sub-circuit SC1 may be a push-down circuit for the second low potential Va formed using, for example, a signal (clock signal, start pulse signal, or the like) to be input to the TFT circuit 101 and a capacitor. Alternatively, the sub-circuit SC1 may include the second TFT 22 and another depression-type TFT (hereinafter referred to as a "third TFT") connected to wiring for supplying the first low potential Vc. A description will be given below of the specific configuration of the sub-circuit SC1.

The TFT circuit 101 of the present embodiment has the second node N2, the second TFT 22, and a sub-circuit SC1 between the first TFT 21 and the low-potential wiring 11. Due to this, it is possible to suppress a decrease in the potential of the first node N1 caused by the leakage current $Ids_{(Vgs=0)}$ of the first TFT 21 and to hold the potential of the first node N1.

In the present specification, a circuit 10 including the first TFT 21, the second node N2, the second TFT 22, and the sub-circuit SC1 provided in a selected node (here, the first node N1) in the TFT circuit is referred to as a "node potential holding circuit". The node potential holding circuit 10 may be provided for each of the plurality of nodes in the TFT circuit. Providing the node potential holding circuit 10 makes it possible to hold the potential of the selected node for a predetermined period and to suppress deterioration of the circuit output characteristics. The reason for this be described below.

Figure 2:
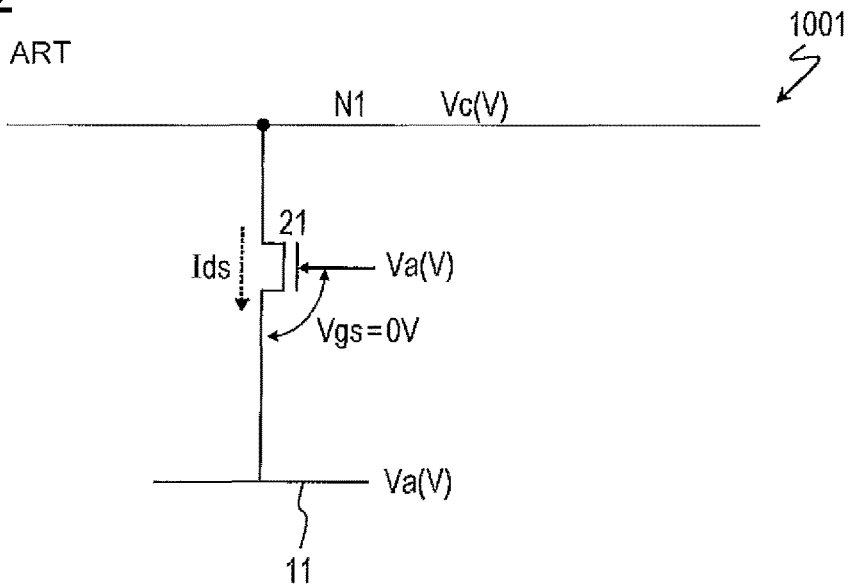
FIG. 2 is a diagram illustrating part of a TFT circuit of Comparative Example.

For comparison, FIG. 2 illustrates a TFT circuit 1001 of Comparative Example 1, which has no node potential holding circuit and in which only the first TFT 21 is arranged between the first node N1 and the low-potential wiring 11. In FIG. 2, the same reference numerals are attached to similar constituent components to those of the TFT circuit 101 illustrated in FIG. 1. In the TFT circuit 1001, the drain terminal of the first TFT 21 is connected to the first node N1, and the source terminal is directly connected to the low-potential wiring 11. For example, the second low potential Va is supplied to the gate terminal.

In the TFT circuit 1001 of Comparative Example 1, when the first TFT 21 is to be turned to an OFF state, the source potential and the gate potential of the first TFT 21 are both Va, and the gate voltage Vgs is 0 (V). Therefore, a comparatively large leakage current $Ids_{(Vgs=0)}$ flows from the first node N1 to the low-potential wiring 11 via the first TFT 21. As a result, the potential of the first node N1 is not held and a predetermined output may not be obtained.

In contrast, in the TFT circuit 101 illustrated in FIG. 1, when the first low potential Va is supplied to the gate terminal of the first TFT 21 and a potential (third low potential) Vb higher than Vc and lower than Va is supplied to the second node N2 by the sub-circuit SC1, the gate potential of the TFT 21 becomes higher than the source potential (Vgs>0 (V)). Accordingly, the first TFT 21 is not strictly turned to an OFF state, the leakage current $Ids_{(Vgs=0)}$ is generated, and the potential of the second node N2 and the potential of the first node N1 are mixed together via the first TFT 21. When the potential of the first node N1 is $V_{(N1)}$ and the potential of the second node N2 is $V_{(N2)}$, the potentials $V_{(N1)}$ and $V_{(N2)}$ are higher than the first low potential Vc and lower than the third low potential Vb (Vc<$V_{(N1)}$, $V_{(N2)}$<Vb). Therefore, in the second TFT 22, since it is possible for the gate potential (the first low potential Vc) to be lower than the source potential $V_{(N2)}$ (Vgs<0), the second TFT 22 is turned to an OFF state. As a result, it is possible to hold the potential of the first node N1 since the first node N1 and the second node N2 enter a floating state.

Second Embodiment

Figure 3:
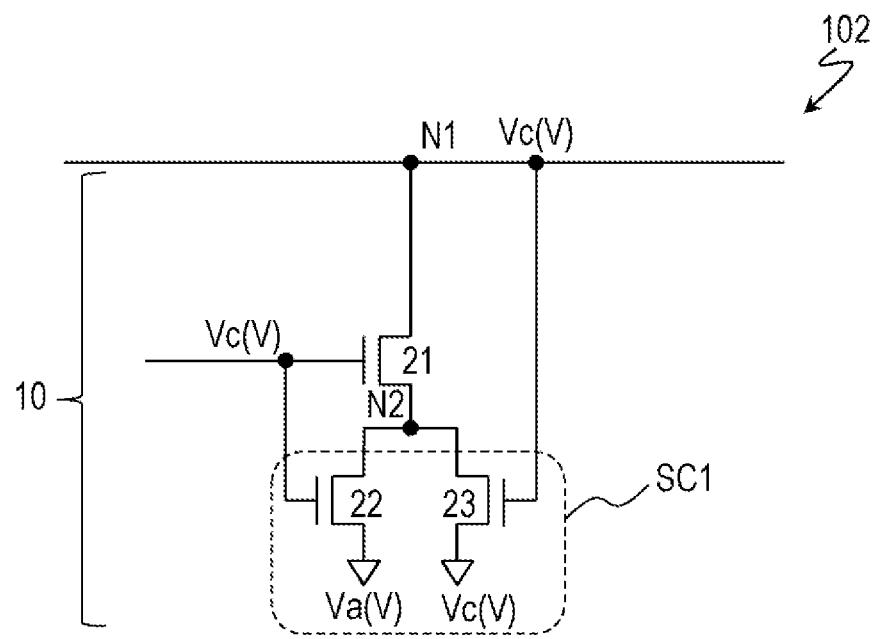
FIG. 3 is a diagram illustrating part of a TFT circuit of a second embodiment.

FIG. 3 is a diagram illustrating part of a TFT circuit 102 of the second embodiment. In FIG. 3, the same reference numerals are attached to similar constituent components to those in FIG. 1, and a description thereof will be omitted.

The TFT circuit 102 is provided with the first node N1 to which the first low potential Vc is supplied, the first TFT 21 connected to the first node N1, and the second TFT 22 arranged between the first TFT 21 and the low-potential wiring which supplies a second low potential Va. For example, the first low potential Vc is supplied to the gate terminals of the first TFT 21 and the second TFT 22. The second node N2 which may enter a floating state is formed between the source terminal of the first TFT 21 and the source terminal of the second TFT 22. A depression-type third TFT 23 is connected to the second node N2.

Also, in the present embodiment, similarly to the first embodiment, the sub-circuit SC1 capable of supplying the third low potential Vb (Vc<Vb<Va) is connected to the second node N2. The sub-circuit SC1 in the present embodiment includes the second TFT 22 and the depression-type third TFT 23. The source terminal of the third TFT 23 is connected to the second node N2, and the drain terminal thereof is connected to the wiring for supplying the first low potential Vc. For example, the first low potential Vc is supplied to the date terminal of the third TFT 23. The gate terminal of the third TFT 23 may be connected to the first node N1.

In the present embodiment, the second low potential Va and the first low potential Vc (Va>Vc) may be supplied from outside as external signals. These low potentials ha and Vc may re power supply potentials. In this case, the drain terminals of the second TFT 22 and the third TFT 23 are respectively connected to power supply wiring which supplies the second low potential Va and power supply wiring which supplies the first low potential Vc.

A description will be given of an example of the operation of the TFT circuit 102. In a non-selection period, the first TFT 21 and the second TFT 22 are in an ON state, and the potential $V_{(N1)}$ of the first node N1 is the second low potential Va. Next, in a selection period, the first low potential Vc is supplied to the gate terminal of the first TFT 21, and the third TFT 23 is turned to an ON state. When the third TFT 23 is turned to an ON state, the source potentials of the second TFT 22 and the third TFT 23 are mixed at the second node N2. As a result, the potential $V_{(N2)}$ of the second node N2 is higher than Vc and lower than Va (Vc<$V_{(N2)}$<Va) in the first TFT 21, since the gate potential (Vc) is lower than the source potential ($V_{(N2)}$) (Vgs<0(V)), the first TFT 21 is turned to an OFF state. Due to this, it is possible to hold the potential of the first node N1, and deterioration of the output characteristics of the TFT circuit 102 is suppressed.

Application Example 1 to Shift Register Circuit

The present embodiment is able to be applied to, for example, a shift register circuit forming a monolithic gate driver. A description will be given below of an example in which the present embodiment is applied to a shift register circuit.

Figure 4:
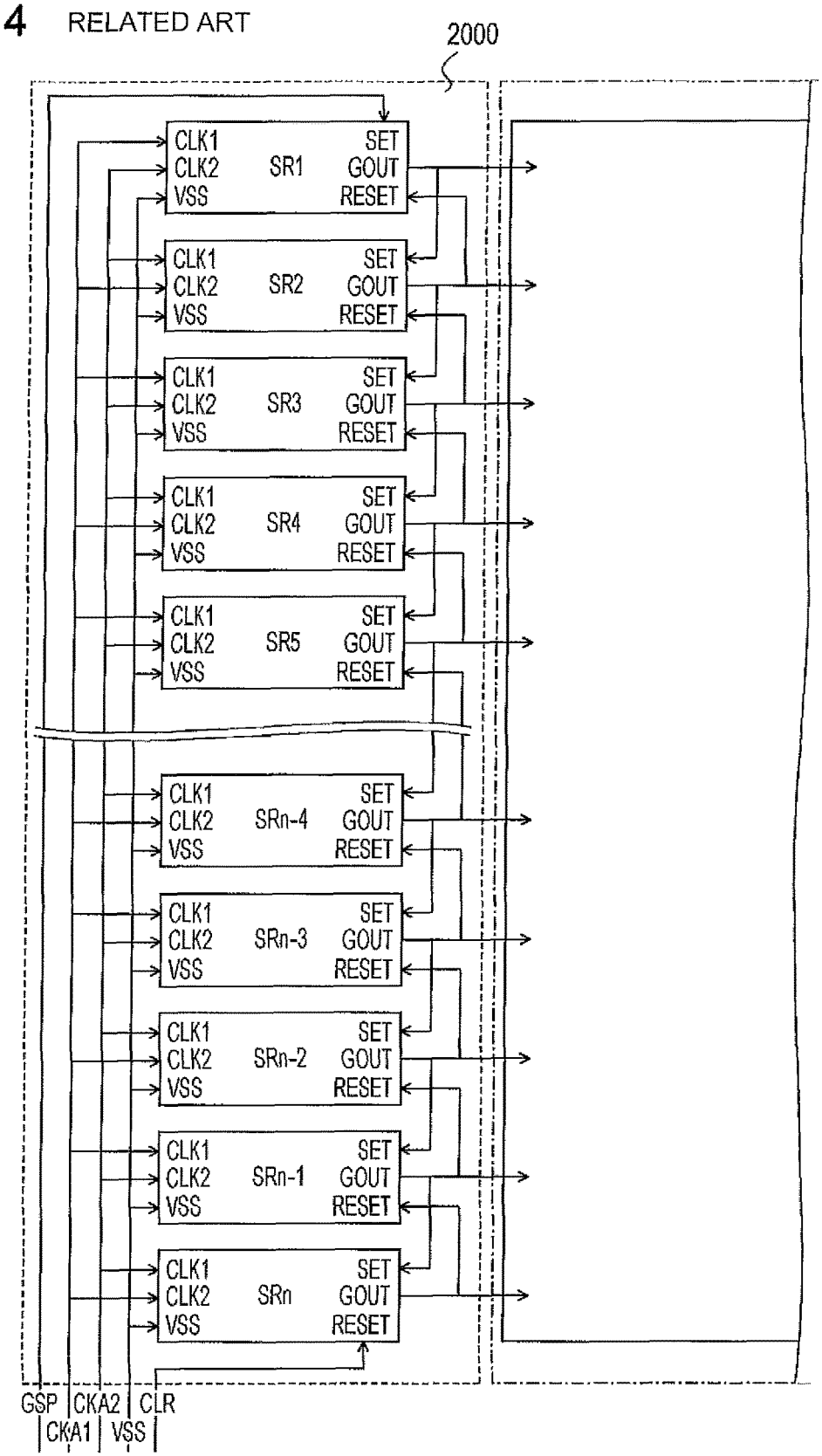
FIG. 4 is a diagram illustrating a configuration of a shift register circuit of Reference Example 1.

First, referring to FIG. 4, a configuration of a shift register circuit 2000 of the related art is illustrated as Reference Example 1. The configuration thereof is disclosed, for example, in International Publication No. 2011/135879.

The shift register circuit 2000 has a plurality of unit circuits (hereinafter referred to as "unit circuits") SR1 to SRn. A unit terminal SRk (k is a natural number of 1≤k≤n) of each stage is provided with a set terminal for inputting a set signal SET, an output terminal for outputting an output signal GOUT, a reset terminal for inputting a reset signal RESET, a low power supply input terminal for inputting a low power supply potential VSS, and a clock input terminal for inputting clock signals CLK1 and CLK2. In the unit circuit SRk (k≥2), the output signal GOUTk−1 of the unit circuit SRk−1 of the preceding stage is input to the set terminal. A gate start pulse signal GSP is input to the set terminal of the unit circuit SR1 of the first stage. In the unit circuit. SRk (k≥1) of each stage, the output terminal outputs the output signal GOUTk to the corresponding scanning signal line arranged in the display region. The output Signal GOUTk+1 of the unit circuit SRk+1 of the next stage is input to the reset terminal of the unit circuit SRk (k=n−1). A clear signal CLR is input to the reset terminal of the unit circuit SRn of the final stage.

The low power supply potential VSS which is the power supply voltage on the low potential side in each unit circuit SRk is input to the low power supply input terminal. The clock signal CLK1 is input to one of the two clock input terminals and the clock signal CLK2 is input to the other clock input terminal. The clock signals to be input to the clock input terminals are configured to alternate between adjacent stages.

The clock signal CLK1 and the clock signal CLK2 have a complementary phase relationship in which active clock pulse periods (here, high level periods) do not overlap each other. The voltage on the high-level side (active side) of the clock signals CLK1 and CLK2 is Vgh and the voltage on the low-level side (inactive side) is Vgl. The low power supply voltage VSS is equal to the voltage Vgl on the low-level side of the clock signals CLK1 and CLK2. The clock signal CLK1 and the clock signal CLK2 may have an opposite phase relationship to each other. Alternatively, the active clock pulse period of one clock signal may be included in the non-active period of the other clock signal (that is, the clock duty is less than ½nd).

The gate start pulse signal GSP is a signal which becomes active during the initial clock pulse period of one frame period. The clear signal CAR is a signal which becomes active (here, high) in the last clock pulse period of one frame period.

In the shift register circuit 2000, at the start of one frame period, the gate start pulse signal GSP is input as a shift pulse to the set terminal of the unit circuit SR1 of the first stage. In the shift register circuit 2000, the unit circuits SRk of respective cascade-connected stages sequentially pass this shift pulse so as to output active pulses of the output signal GOUTk.

As Reference Example 1, a description will be given of the configuration of the unit circuit. SRk disclosed in PTL 1.

Figure 5:
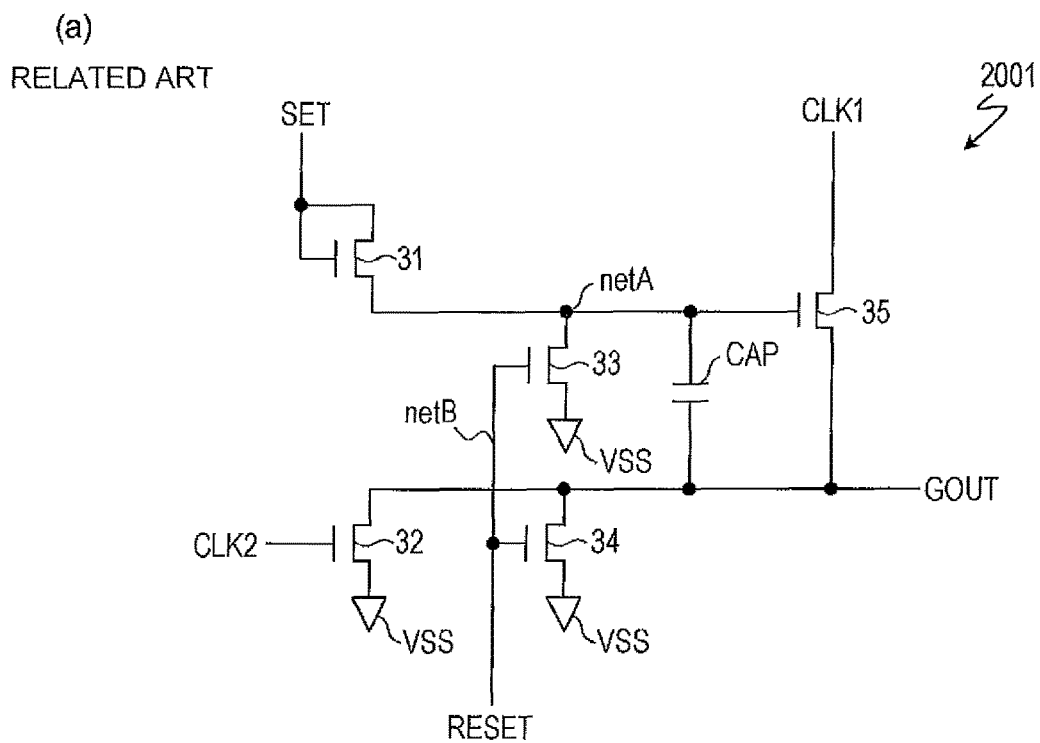
FIG. 5A is a diagram illustrating a TFT circuit of Reference Example 1.
FIG. 5B is a diagram illustrating signal waveforms (timing charts) in the TFT circuit.
Figure 5:
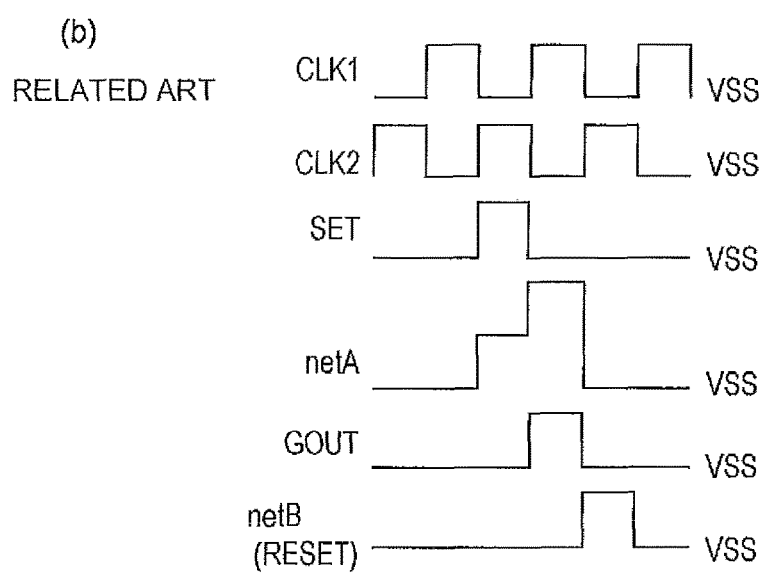

FIG. 5A is a diagram illustrating the unit circuit SRk (hereinafter simply referred to as "TFT circuit") 2001 of Reference Example 1. FIG. 5B is a diagram illustrating signal waveforms in the TFT circuit 2001.

The TFT circuit 2001 of Reference Example 1 is provided with five n-channel TFTs 31 to 35 and a capacitor CAP. All of these TFTs are enhancement-type TFTs.

The TFT 31 is an input transistor. A gate and a drain of the TFT 31 are connected to the set terminal, and a source of the TFT 31 is connected to a crate of the TFT 35. The TFT 35 is an output transistor. A drain and a source of the TFT 35 are connected to the clock input terminal and the output terminal, respectively. That is, as the transmission gate, the TFT 35 transmits and interrupts the clock signal CLK1 to be input to the clock input terminal. The capacitor CAP is connected between the gate and the source of the TFT 35. In this specification, the node connected to the gate of the TFT 35 (output transistor) is referred to as the "node netA". In addition, the node connected to the output terminal is referred to as the "node GOUT".

The TFT 33 is arranged between the low power supply input terminal and the node netA. The TFT 33 is a pull-down transistor for lowering the potential of the node netA. A gate, a drain, and a source of the TFT 33 are connected to the reset terminal, the node netA, and the low power supply input terminal, respectively. A node connected to the gate of the pull-down transistor (here, the TFT 33) is referred to as the "node netB".

The TFTs 32 and 34 are connected to the node GOUT. A gate, a drain, and a source of the TFT 34 are connected to the reset terminal, the output terminal, and the low power supply input terminal, respectively. The gate of the TFT 32 is connected to the input terminal of the clock signal CLK2, the drain is connected to the output terminal, and the source is connected to the low power supply input terminal, respectively.

In the TFT circuit 2001, until the shift pulse is input to the set terminal, the TFTs 34 and 35 are in a high impedance state, the TFT 32 is turned to an ON state each time the clock signal CLK2 to be input from the clock input terminal is high level, and the output terminal is in the period for holding low.

As illustrated in FIG. 5B, when a shift pulse is input to the set terminal, the generation period of the gate pulse which is the active pulse of the output signal GOUT is started, and the TFT 31 is turned to an ON state to charge the capacitor CAP. When the high level of the gate pulse is Vgh and the threshold voltage of the TFT 31 is Vth due to the capacitor CAP being charged, the potential $V_{(netA)}$ of the node netA rises to Vgh−Vth ($V_{(netA)}$=Vgh−Vth). As a result, the TFT 35 is turned to an ON state and the clock signal CLK1 input from the clock input terminal appears at the source of the TFT 35. Since the potential of the node netA is pushed up due to the bootstrap effect of the capacitor CAP at the moment when this clock pulse (high level) is input, the TFT 35 obtains a large overdrive voltage. Due to this, substantially the entire amplitude of the Vgh of the clock pulse input to the clock input terminal is transmitted to the output terminal and output to become the gate pulse.

When the input of the shift pulse to the set terminal is finished, the TFT 31 is turned to an OFF state and the netA is held in the floating state. After the gate output (GOUT) is completed, the floating state of each node is canceled by the reset pulse signal. Specifically, the gate pulse of the unit circuit SRk+1 of the next stage is input to the reset terminal as a reset pulse. Due to this, the TFTs 33 and 34 are turned to an ON state and the node netA and the output terminal are connected to the low power supply voltage VSS. Accordingly, the TFT 35 is turned to an OFF state. When the input of the reset pulse is finished, the generation period of the gate pulse of the TFT circuit 2001 finishes and toe output terminal is in the period for holding low again.

In the TFT circuit 2001 described above, when depression-type TFTs are used as the TFTs 31 to 35, there is a concern that the output characteristics of the circuit will be deteriorated by the leakage current $Ids_{(Vgs=0)}$ in part of the TFTs. For example, when the leakage current $Ids_{(Vgs=0)}$ occurs without the TFT 33 being turned to an OFF state during the generation period of the gate pulse, the potential of the node netA is not held. In addition, when the leakage current $Ids_{(Vgs=0)}$ is generated in the TFT 32, the potential of the node GOUT is not held.

In the present embodiment, as an example, the node potential holding circuit 10 described above with reference to FIG. 3 provided for the node netA and the node GOUT in the TFT circuit 2001.

Figure 6:
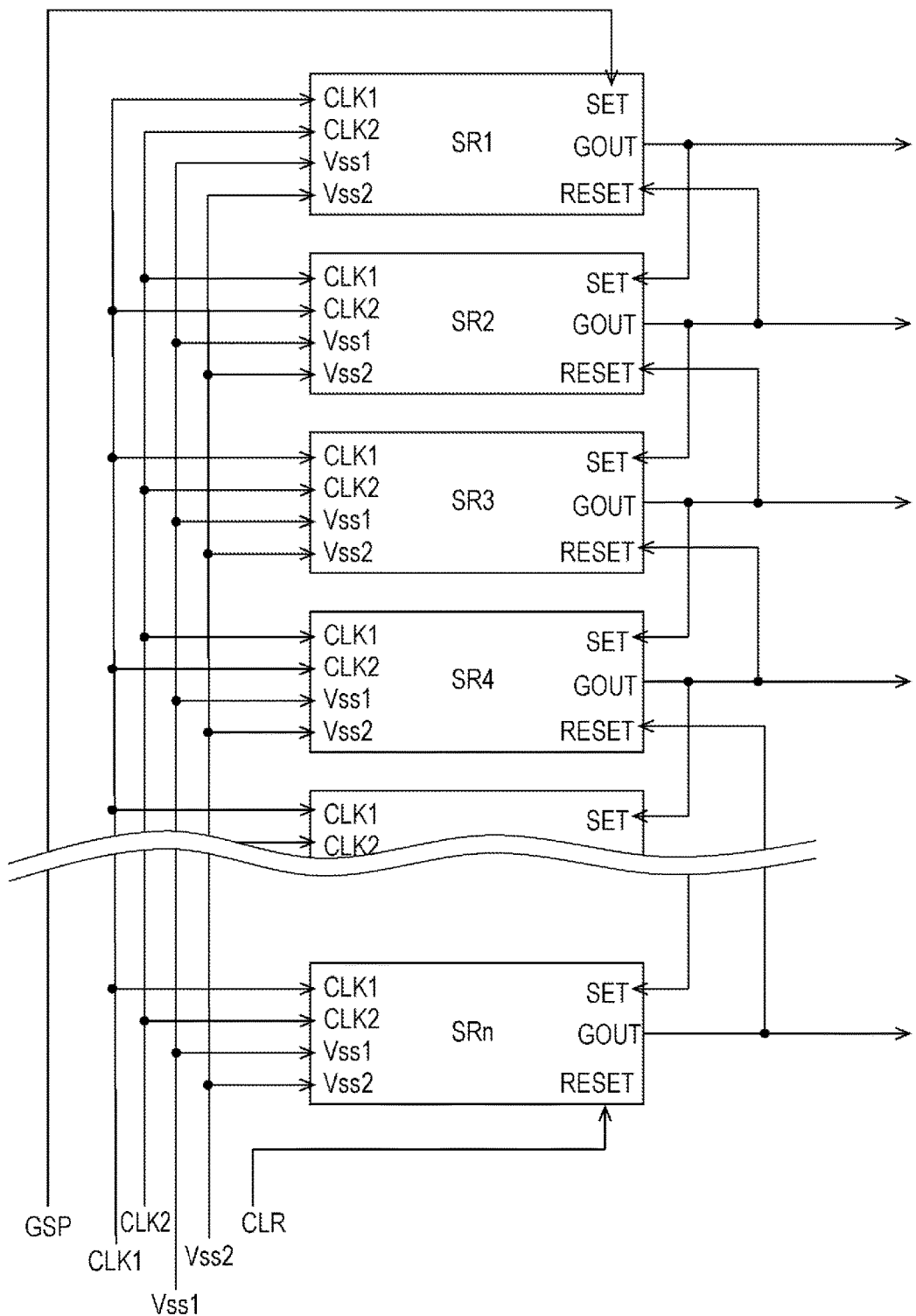
FIG. 6 is a diagram illustrating a configuration of a shift register circuit according to a second embodiment.

FIG. 6 is a diagram illustrating the configuration of the shift register circuit according to the present embodiment. The shift register circuit is different from the shift register circuit 2000 in FIG. 4 in the point that two types of low power supply potentials Vss1 and Vss2 are input.

Figure 7:
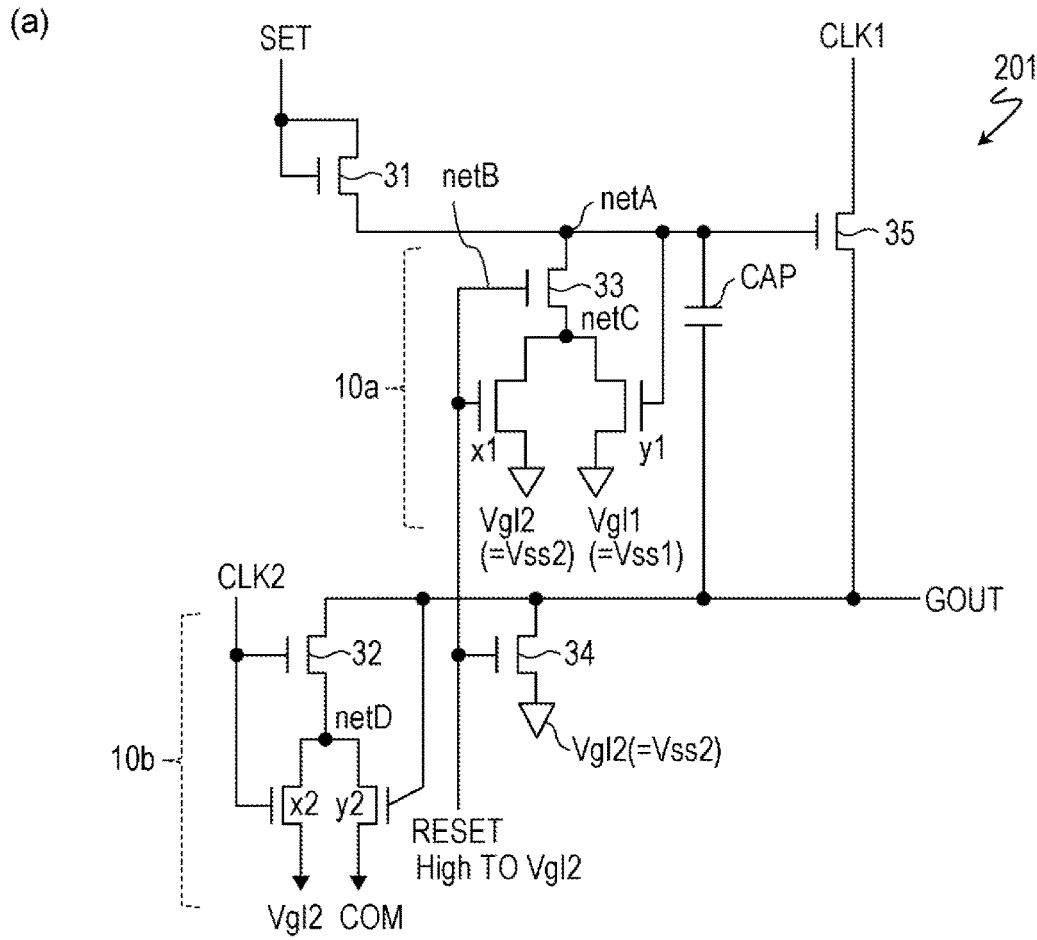
FIG. 7A is a diagram illustrating a TFT circuit which is a unit circuit of a shift register circuit.
FIG. 7B is a diagram illustrating signal waveforms in a TFT circuit.
Figure 7:
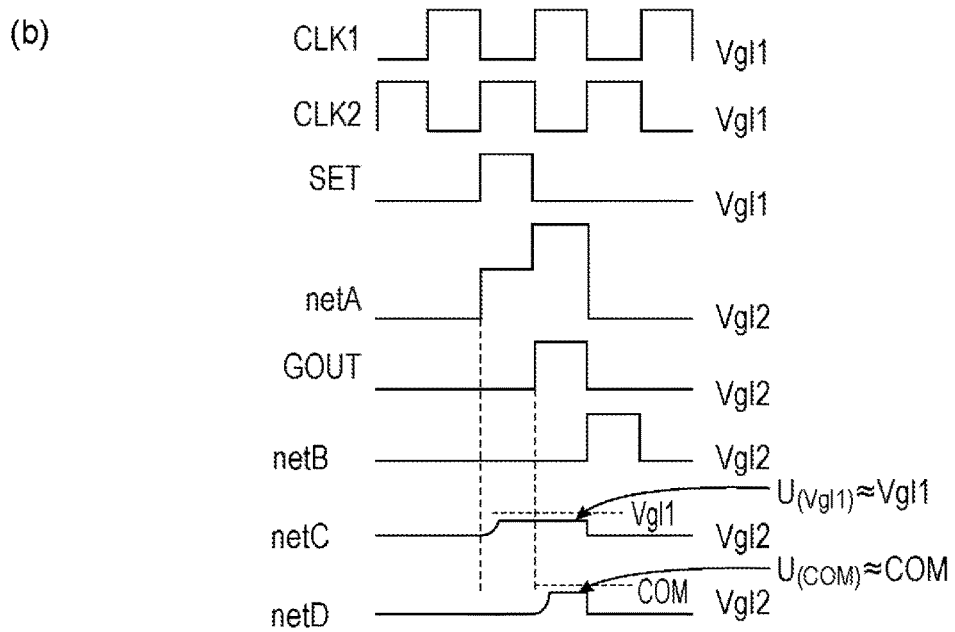

FIG. 7A is a diagram illustrating the TFT circuit 201 of the present embodiment. The TFT circuit 201 is a unit circuit SRk forming the shift register circuit. In FIG. 7A, the same reference numerals are attached to similar constituent components to those of the TFT circuit 2001 of Reference Example 1. In addition, FIG. 7B is a diagram illustrating the waveform of each signal in the TFT circuit 201. In the following description, descriptions of configurations and operations the same as those of the TFT circuit 2001 of Reference Example 1 be omitted.

In the TFT circuit 201, two types of low potentials Vgl1 and Vgl2 are supplied from outside. The low potential Vgl2 is lower than the low potential Vgl1 (Vgl1>Vgl2). That is, the low potential Vgl1 and the low potential Vgl2 correspond to the second low potential Va and the first low potential Vc, respectively. In the present embodiment, the low potentials Vgl1 and Vgl2 are low power supply potentials Vss1 and Vss2, respectively. Therefore, the TFT circuit 201 has a low power supply input terminal for inputting the low potential Vgl1 (=Vss1) and a low power supply input terminal for inputting the low potential Vgl2 (=Vss2).

Each of the TFTs 31 to 35 forming the TFT circuit 201 is a depression-type TFT. In the node netA of the TFT circuit 201, a first node potential holding circuit 10a including the TFT 33 is provided. In addition, the node GOUT is provided with a second node potential holding circuit 10b including the TFT 32. Here, the node potential holding circuit may be provided only in either the node netA or the node GOUT. Alternatively, similar node potential holding circuits may be provided in other nodes.

The first node potential holding circuit 10a includes the TFT 33, and a TFT x1 and a TFT y1, which are depression-type. The TFT 33, the TFT y1, and the TFT x1 correspond to the first TFT, the second TFT, and the third. TFT illustrated in FIG. 3, respectively. A source terminal of the TFT x1 and a source terminal of the TFT y1 are both connected to the source terminal of the TFT 33. A node netC which is able to enter a floating state is formed between the three of the TFT 33, the TFT x1, and the TFT y1. A drain terminal of the TFT x1 is connected to the input terminal of the low potential Vgl2, and a gate terminal thereof is connected to the node netB. A low potential Vgl2 is supplied to the node netB. On the other hand, the drain terminal of the TFT y1 is connected to the input terminal of the low potential Vgl1, and the gate terminal thereof is connected to the node netA. A low potential Vgl2 is supplied to the node netA.

As illustrated in FIG. 7B, in the non-selection period, the TFT 33 and the TFT x1 are turned to an ON state and the node netA is set to the low potential Vgl2. In the selection period, the TFT y1 is turned to an ON state, and at the node netC, the source potential of the TFT y1 and the source potential of the TFT x1 are mixed. For this reason, the potential $V_{(netC)}$ of the node netC is higher than Vgl2 and lower than Vgl1 (Vgl2<$V_{(netC)}$<Vgl1). As a result, since the gate potential Vgl2 of the TFT 33 becomes lower than the source potential $V_{(netC)}$, the TFT 33 is turned to an OFF state. In a similar manner, since the TFT x1 is also turned to an OFF state, the potential $V_{(netC)}$ of the node netC becomes a value $U_{(Vgl1)}$ close to Vgl1 in a range satisfying Vgl2<$V_{(netC)}$<Vgl1. In the present specification, a value lower than the potential X and close to the potential X is denoted as $U_{(X)}$ (X>$U_{(X)}$ and X≈$U_{(X)}$).

In this manner, since the TFT 33 is turned to an OFF state during the selection period, the node netA enters a floating state and it is possible to hold the potential of the node netA. For this reason, it is possible to suppress output defects caused by the leakage current of the TFT 33.

The second node potential holding circuit 10b includes the TFT 32 and a TFT x1 and a TFT y2, which are depression-type. The TFT 32, TFT y2, and TFT x2 correspond to the first TFT, the second TFT, and the third TFT illustrated in FIG. 3, respectively. The source terminal of the TFT x2 and the source terminal of the TFT y2 are both connected to the source terminal of the TFT 32. A node netD which is able to enter a floating state is formed between the three of the TFT 32, the TFT x2 and the TFT y2. A drain terminal of the TFT x2 is connected to the input terminal of the low potential Vgl2, and a gate terminal thereof is connected to the clock input terminal for inputting the clock signal CLK2. The low potential Vgl1 is supplied to a gate terminal of the TFT x2. On the other hand, a wiring or a terminal for supplying a common potential COM higher than the low potentials Vgl1, Vgl2 (COM>Vgl1>Vgl2) is connected to the drain terminal of the TFT y2. A gate terminal of the TFT y2 is connected to the node GOUT. A low potential Vgl2 is supplied to the node GOUT.

As illustrated in FIG. 7B, in the non-selection period, the TFT 32 and the TFT x2 are turned to an ON state and the node GOUT is set to the low potential Vgl2. In the selection period, TFT y2 is turned to an ON state and a source potential of the TFT y2 and a source potential of the TFT x2 are mixed at the node netD. For this reason, a potential $V_{(netD)}$ of the node netD is higher than Vgl2 and lower than COM (Vgl2<$V_{(netD)}$<COM). As the potential $V_{(netD)}$ of the node netD rises, the current flowing through the TFT x2 decreases, and when the potential $V_{(netD)}$ of the node netD exceeds Vgl1, the TFT x2 and the TFT 32 are turned to an OFF state. Since the TFT x2 is turned to an OFF state, the potential $V_{(netD)}$ of the node netD is a value $U_{(COM)}$ close to COM in a range satisfying Vgl2<$V_{(netD)}$<COM. In this manner, since it is possible to turn the TFT 32 to an OFF state, it is possible to hold the potential of the node GOUT, and to suppress output defects caused by the off-leak current of the TFT 32.

Application Example 2 to Shift Register Circuit

A description will be given of another example in which the present embodiment is applied to a shift register circuit with reference to the drawings. In this example, a clear signal is supplied to each unit circuit SRk. In addition, four-phase clock signals are used.

FIG. 8A and FIG. 8B are a diagram of the TFT circuit 2002 of Reference Example 2 and a diagram illustrating signal waveforms of the TFT circuit 2002, respectively. The TFT circuit 2002 in Reference Example 2 is one of the unit circuits SRk in the shift register circuit, and is configured using enhancement-type TFTs.

The TFT circuit 2002 has ten TFTs 40 to 49, the capacitor CAP, the low power supply input terminal for inputting the low potential Vss, the clock input terminal for inputting any one of the four-phase clock signals CLK1 to CLK4, the set terminal for inputting a set signal SET, the reset terminal for inputting a reset signal RESET, a clear terminal for inputting a clear signal CLR, and the output terminal for outputting an output signal GOUT.

The TFT 41 is an input transistor and the TFT 47 is an output transistor. The TFTs 48, 45, and 42 are connected to the node netA connected to a gate of the TFT 47 (output transistor). The TFTs 49, 44, and 43 are connected to the node netB connected to a gate of the TFT 45. The TFTs 40 and 46 are connected to the node GOUT.

When the TFT circuit 2002 of Reference Example 2 is formed using depression-type TFTs, there is a possibility that the potentials of the nodes netA and the node netB will not be held due to the leakage current $Id_{(Vgs=0)}$ of the TFTs 44 and 45, for example.

As illustrated in FIG. 8B, the TFT circuit 2002 performs interlace driving using, for example, four-phase clock signals (the first clock signal CLK1 to the fourth clock signal CLK4). First, when the set signal SET is turned ON, the capacitor CAP is charged and the node netA is pre-charged to a high level. Next, when the first clock signal CLK1 changes from the low level to the high level, the potential of the node netA rises to 2 Vgh due to the bootstrap effect of the capacitor CAP. Due to this, almost the entire amplitude of Vgh of the clock pulse is transmitted to the output terminal, and the output signal GOUT becomes high level. Thereafter, when the reset pulse signal is input, the floating state of each node is canceled and the node netA and the node GOUT are set to the low level.

In the present embodiment, as an example, the node potential holding circuit 10 described above with reference to FIG. 3 is provided for the node netA and the node nets in the TFT circuit 2002.

FIG. 9A and FIG. 9B are diagrams illustrating another TFT circuit, 202, of the present embodiment and signal waveforms of the TFT circuit 202, respectively. In this example, all the TFTs forming the TFT circuit 202 are depression-type TFTs.

In the TFT circuit 202, in a similar manner to the TFT circuit 201, two types of low potentials Vgl1 and Vgl2 are supplied from outside (Vgl1>Vgl2). In this example, the low potentials Vgl1 and Vgl2 are low power supply potentials. Accordingly, the TFT circuit 202 has a low power supply input terminal for inputting the low power supply potential Vgl1 and a low power supply input terminal for inputting the low power supply potential Vgl2.

All of the TFTs 40 to 49 forming the TFT circuit 202 are depression-type TFTs. The node netB in the TFT circuit 202 is provided with a third node potential holding circuit 10c including the TFT 44. In addition, in the node netA, a fourth node potential holding circuit 10d including the TFT 45 is provided. Here, the node potential holding circuit may be provided only in either the node netA or the node netB. Alternatively, a node potential holding circuit may be provided in another node.

The third node potential holding circuit 10c includes the TFT 44 and a TFT x3 and a TFT y3, which are depression-type. The TFT 44, the TFT y3, and the TFT x3 correspond to the first TFT, the second TFT, and the third TFT illustrated in FIG. 3, respectively. A source terminal of the TFT x3 and a source terminal of the TFT y3 are both connected to the source terminal of the TFT 44. A node netE which is able to enter a floating state is formed between the three of the TFT 44, the TFT x3, and the TFT y3. A drain terminal of the TFT x3 is connected to the low power supply input terminal of low potential Vgl2, and a gate terminal is connected to the node netA. The low potential Vgl2 is supplied to the node netA via the TFT 45 and the TFT x4 during the non-selection period. On the other hand, the drain terminal of the TFT y3 is connected to the input terminal of the low potential. Vgl1, and the gate terminal thereof is connected to the node netB. In the selection period, the low potential Vgl2 is supplied to the node netB.

In the selection period of the TFT 44, the potential $V_{(netE)}$ of the node nets is a value $H_{(Vgl2)}$ close to Vgl2 in a range satisfying Vgl2<$V_{(netE)}$<Vgl1. The potential $H_{(Vgl2)}$ is a value greater than Vlg2 and close to Vlg2 (Vlg2<$H_{(Vgl2)}$ and Vlg2≈$H_{(Vgl2)}$). In the non-selection period, a source potential of the TFT y3 and a source potential of the TFT x3 are mixed via the TFT y3 and the TFT x3. For this reason, the potential $V_{(netE)}$ of the node netE has a potential between Vgl2 and Vgl1. Since the potential $V_{(netE)}$ of the node netE becomes higher than the gate potential ($H_{(Vgl2)}$) of the TFT 44 and the TFT x3, the TFT 44 is turned to an OFF state. Vgl1 is forcibly subtracted by the TFT y3 and mixed with Vgl2, and the potential $V_{(netE)}$ of the node nets becomes a value $U_{(Vgl1)}$ close to Vgl1 in a range satisfying Vgl2<$V_{(netC)}$<Vgl1. In this manner, since it is possible to turn the TFT 44 to an OFF state, it is possible to reduce the through current from the TFT 43 to the TFT 44 during the non-selection period, and to suppress the potential of the node netB (the potential supplied to the gate terminal of the TFT 45) from decreasing.

The fourth node potential holding circuit 10d includes the TFT 45, and the TFT x4 and a TFT y4, which are depression-type. The TFT 45, the TFT y4, and the TFT x4 correspond to the first TFT, the second TFT, and the third TFT illustrated in FIG. 3, respectively. A source terminal of the TFT x4 and a source terminal of the TFT y4 are both connected to a source terminal of the TFT 45. A node netF which is able to enter a floating state is formed between the three of the TFT 45, the TFT x4, and the TFT y4. The low potential Vgl2 is supplied to the drain terminal of the TFT x4. A gate terminal of the TFT x4 is connected to the node netB. In the selection period, the low potential Vgl2 is supplied to the node netB. On the other hand, a COM potential (Vgl2<Vgl1<COM) is supplied to a drain terminal of the TFT y4. A gate terminal of the TFT y4 is connected to the node netA. In the non-selection period, the low potential Vgl2 is supplied to the node netA.

In the non-selection period of the TFT 45, the TFT 45 and the TFT x4 are in an ON state, and the potential $V_{(netF)}$ of the node netF becomes a value $H_{(Vgl2)}$ close to Vgl2 in a range satisfying Vgl2<$V_{(netF)}$<COM. In the selection period, the source potential of the TFT y4 and the source potential of the TFT x4 are mixed via the TFT y4 and the TFT x4. For this reason, the potential $V_{(netF)}$ of the node netE is the potential between Vgl2 and COM. Since the potential $V_{(netF)}$ of the node netF becomes higher than the gate potential ($H_{(Vgl2)}$) of the TFT 45 and the TFT x4, the TFT 45 is turned to an OFF state. COM is forcibly subtracted by the TFT y4 and mixed with Vgl2, and the potential $V_{(netF)}$ of the node netF becomes a value $U_{(COM)}$ close to COM in a range satisfying Vgl2<$V_{(netC)}$<COM. In this manner, since it is possible to turn the TFT 45 to an OFF state, it is possible to hold the potential of the node netA.

Figure 8:
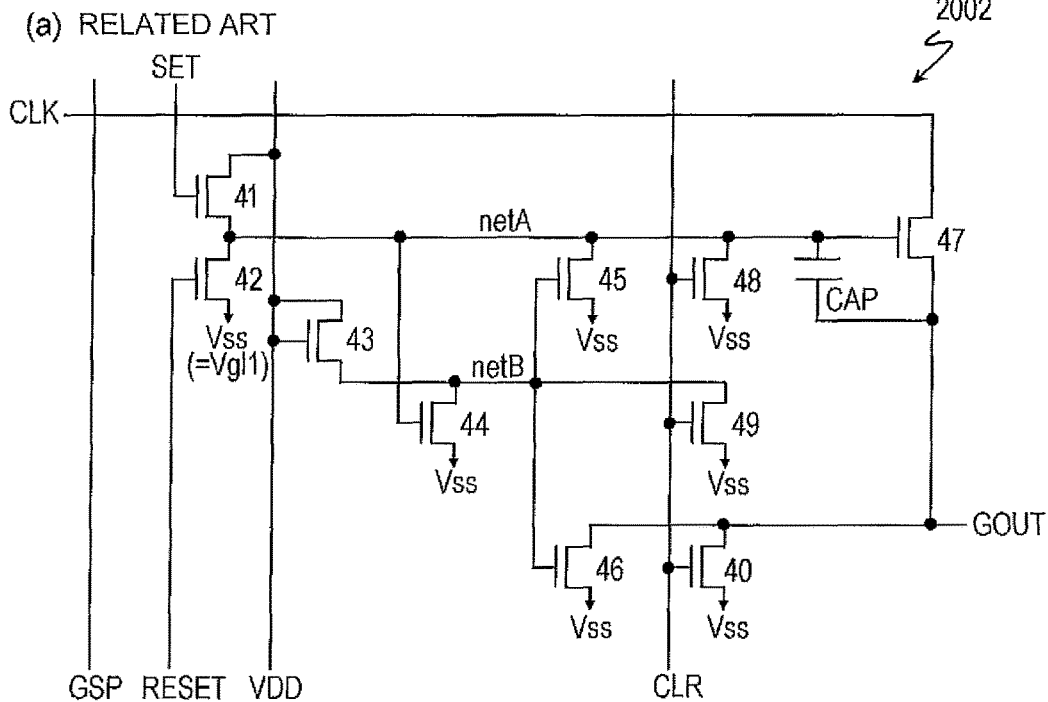
FIG. 8A is a diagram illustrating a TFT circuit of Reference Example 2.
FIG. 8B is a diagram illustrating signal waveforms in a TFT circuit.
Figure 8:
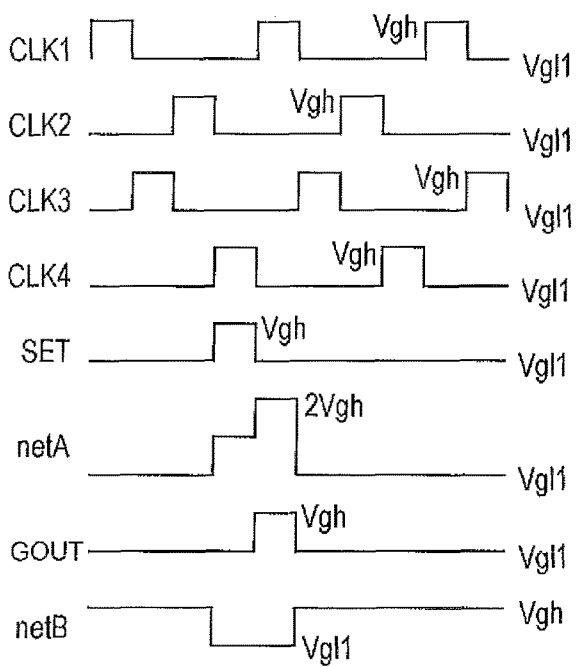

In addition, the connection destination of the TFT 42 of the TFT circuit 202 is different from that of the TFT circuit 2002 illustrated in FIG. 8. In a case of using a depression-type TFT as the TFT 42, when the source of the TFT 42 is connected to the node netA as in the TFT circuit 2002 illustrated in FIG. 8, the node netA is held in a floating state by the leakage current of the TFT 42 at the time of bootstrapping. On the other hand, in the TFT circuit 202, since the connection destination of the TFT 42 is changed from the node netA, it is possible to hold the floating state of the node netA at the time of bootstrapping and to suppress a decrease in the pre-charge potential which is the potential when the set signal SET is ON.

The TFT 47, which is an output transistor, operates as follows. In the selection period, the gate potential (the potential of the node netA) is 2 Vgh and the source potential is Vgh. In the non-selection period, the gate potential (potential of the node netA) is $H_{(Vgl2)}$, the source potential is Vgl1, and the TFT 47 is turned to an OFF state.

Figure 9:
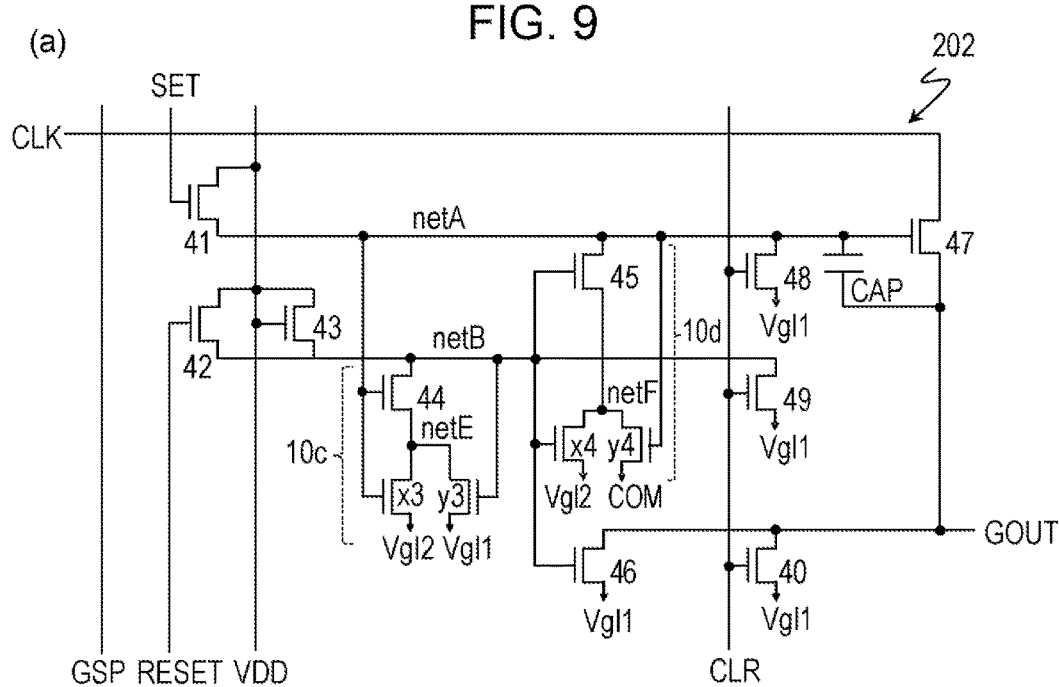
FIG. 9A is a diagram illustrating a TFT circuit which is a unit circuit of another shift register circuit of the second embodiment.
FIG. 9B is a diagram illustrating signal waveforms in the TFT circuit.
Figure 9:
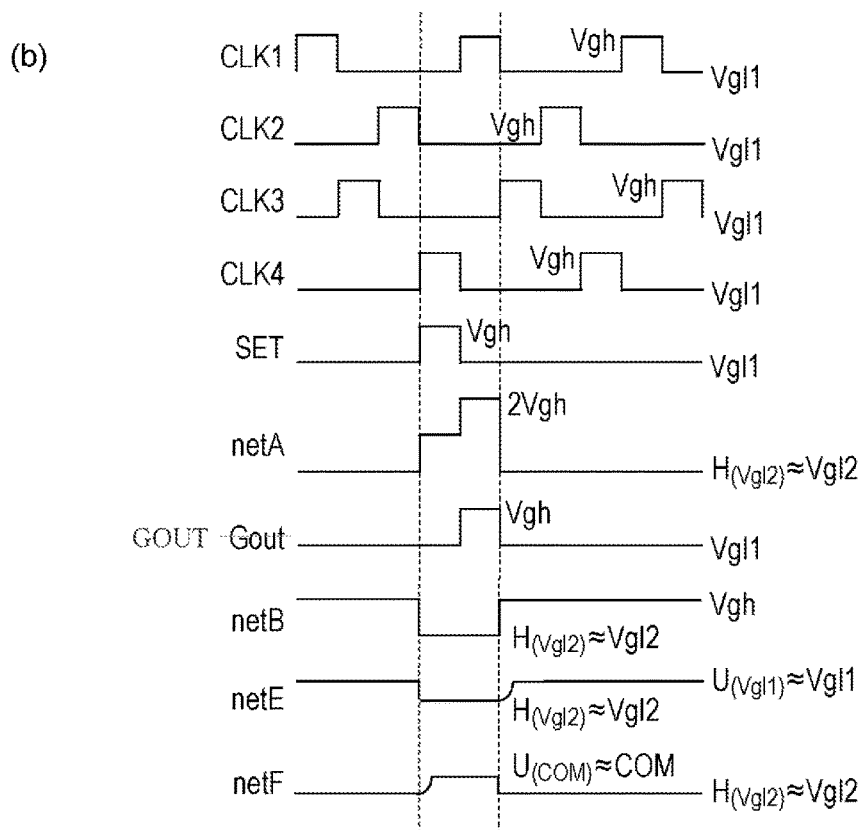

In the example illustrated in FIG. 9, the drain terminal of the TFT y3 is connected to the terminal which supplies the low potential Vgl1, but may be connected to the terminal which supplies the COM potential instead. In addition, the drain terminal of the TFT y4 is connected to the terminal which supplies the COM potential, but may be connected to the terminal which supplies the low potential Vgl1 instead.

The configuration of the shift register circuit of the present embodiment is not limited to the example described with reference to FIG. 4 to FIG. 9. It is possible to apply the present embodiment to various shift register circuits. In a case of being applied to a shift register circuit, if a node potential holding circuit is provided for at least one of the node netA, the node netB, and the node GOUT, it is possible to more effectively suppress deterioration of the output characteristics.

Third Embodiment

The TFT circuit of the third embodiment is different from the TFT circuit of the above embodiment in the point that a node potential holding circuit including two types of push-down circuits is formed for the depression-type TFTs.

Figure 10:
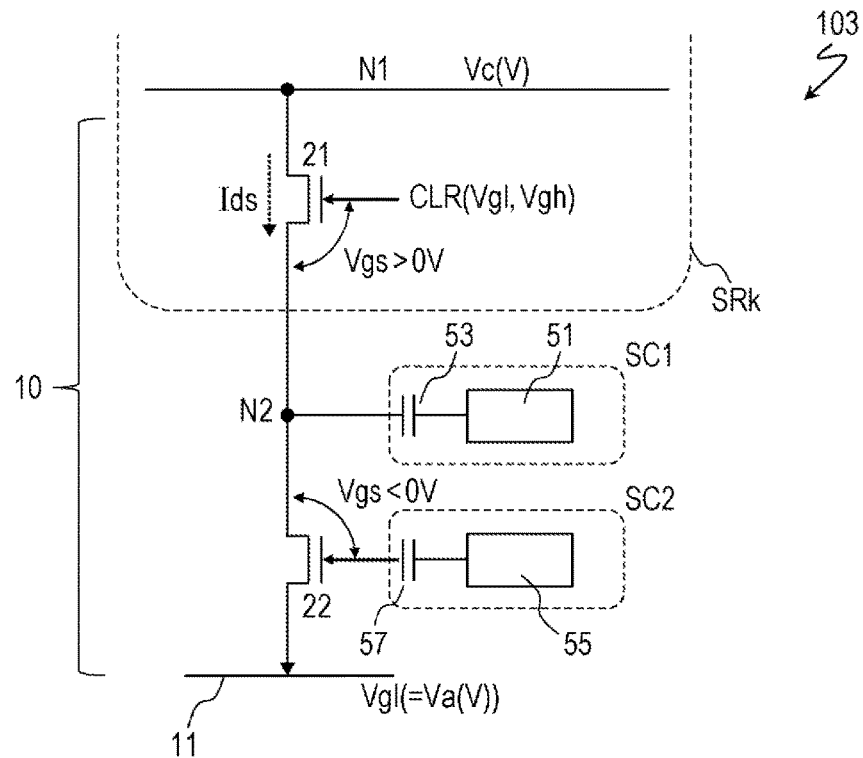
FIG. 10A is a diagram illustrating part of the TFT circuit of the third embodiment.
FIG. 10B is a diagram illustrating signal waveforms of the TFT circuit.
Figure 10:
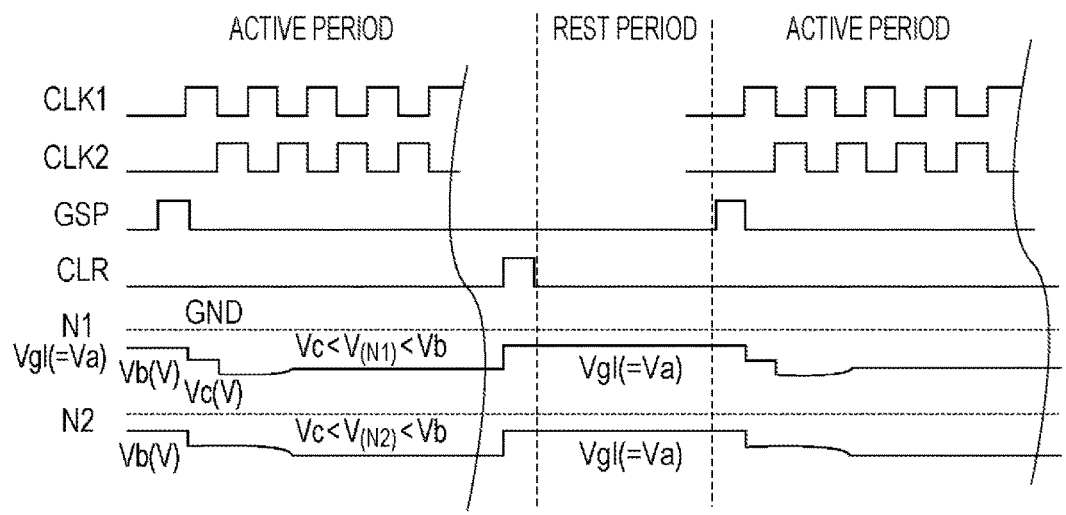

FIG. 10A is a diagram illustrating part of a TFT circuit 103 of the third embodiment. In FIG. 10A, the same reference numerals are attached to similar constituent components to those in FIG. 1 and a description thereof will be omitted.

The TFT circuit 103 is provided with the first node N1 to which the first low potential Vc is supplied, the first TFT 21 connected to the first node N1, and the second TFT 22 arranged between the first TFT 21 and the low-potential wiring 11. The low-potential wiring 11 is wiring for supplying the second low potential Va. The gate terminal of the first TFT 21 is connected to a clear terminal, for example. Alternatively, the second low potential Va is supplied to the gate terminal.

The second node N2 is connected to the sub-circuit SC1 which supplies the third low potential Vb lower than the second low potential Va and higher than the first low potential Vc. The sub-circuit SC1 includes, for example, a push-down circuit 51 for pushing down the potential of the second node N2 once by using a plurality of signals to be input to the TFT circuit 103, and a capacitor 53 arranged between the push-down circuit 51 and the second node N2.

In addition, the sub-circuit SC2 for supplying the first low potential Vc is connected to the gate terminal of the second TFT 22. The sub-circuit SC2 includes a push-down circuit 55 for pushing down the potential of the gate terminal of the second TFT twice by using a plurality of signals to be input to the TFT circuit 103, and a capacitor 57 arranged between the push-down circuit 55 and the gate terminal. Although not illustrated, the push-down circuit 55 is also connected to the first node N1, and the pushed down potential (the first low potential Vc) is also supplied to the first node N1.

The number of times of pushing down in the push-down circuits 51 and 55 is not limited to the numbers described above. When the number of times of pushing down in the push-down circuits 51 and 55 are n and m, respectively, it is sufficient if n<m. Due to this, since it is possible to set the potential to be supplied to the gate terminal of the second TFT 22 to be lower than the third low potential Vb supplied to the second node N2, which is the source side of the second TFT 22, it is possible to turn the second TFT 22 to an OFF state.

In the present embodiment, the second low potential Va is a low power supply potential, and the first low potential Vc and the third low potential Vb are new signals generated by the push-down circuits 51 and 55. Due to this, it is possible to configure the TFT circuit 103 without adding a signal supplied from outside.

Figure 11:
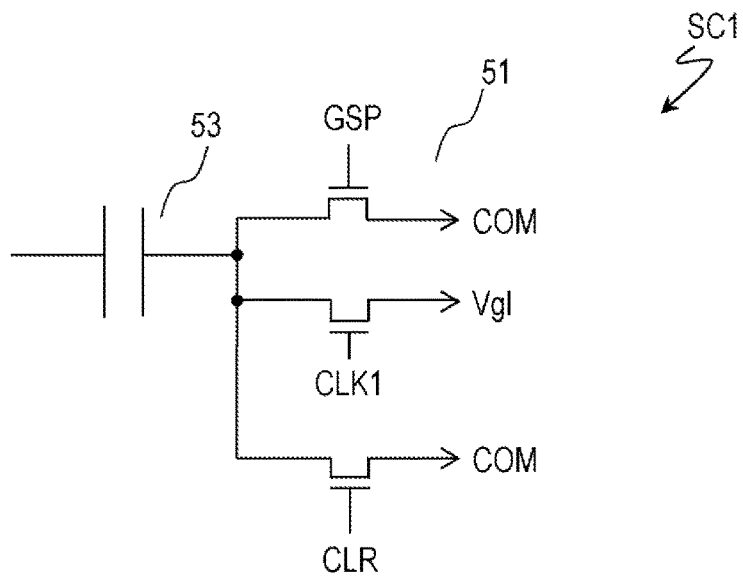
FIG. 11 is a diagram illustrating a sub-circuit SC1 in the TFT circuit.

The configuration of the push-down circuits 51 and 55 is not particularly limited. The push-down circuits 51 and 55 may be formed using signals to be input from outside to the TFT circuit 101, for example, the clock signals CLK1 and CLK2, the gate start pulse signal GSP, or the like. An example of the sub-circuit SC1 including the push-down circuit 51 is illustrated in FIG. 11.

As an example, the first TFT 21 may be a clear transistor of the unit circuit SRk in the shift register circuit. A "clear transistor" is a TFT in which the clear signal CLR is input to a gate and in which a drain or source is connected to the low-potential wiring. For example, in the TFT circuit 202 illustrated in FIG. 9, the TFTs 48, 49, and 40 are clear transistors. In a case where the first TFT 21 is a clear transistor of the unit circuit SRk, the first node N1 is, for example, the node netA, the node netB, or the node GOUT.

Although FIG. 10A illustrates only the clear transistor of one unit circuit SRk, the clear transistors in the unit circuits of a plurality of stages may be connected to the common second node N2. Providing a common circuit including the second TFT 22, the second node N2, and the sub-circuits SC1 and SC2 for the clear transistor in the plurality of stages of the unit circuits SRk makes it possible to suppress deterioration of the output characteristics caused by the leakage current of the clear transistor, without increasing the size of each unit circuit SRk.

FIG. 10B is a diagram illustrating each signal waveform in the TFT circuit 103. Here, the signal waveforms of the two types of clock signals CLK1 and CLK2, the gate start pulse signal GSP, the clear signal CLR, the first node N1, and the second node N2 are illustrated.

In the active period, the second node N2 is pushed down to the third low potential Tb by the push-down circuit 51, and the first node N1 is pushed down to the first low potential Vc by the push-down circuit 55. The potentials $V_{(N1)}$ and $V_{(N2)}$ of the first node N1 and the second node N2 are mixed via the first TFT 21 in which the gate voltage Vgs is positive (Vgs≥0(V)) to become a potential higher than the first low potential Vc and lower than the third low potential Vb (Vc<$V_{(N1)}$, $V_{(N2)}$<Vb). In the second TFT 22, since the gate potential Vc is lower than the potential V (N2) of the second node N2 which is the source potential (Vgs<0), the second TFT 22 is turned to an OFF state. Due to this, the first node N1 and the second node N2 are mixed and held at the same potential $U_{(Vb)}$ (V) (Vc<$U_{(Vb)}$<Vb). The potentials of the first node N1 and the second node N2 are reset to the second low potential Va (=Vgl) when the clear signal CLR becomes the high level.

<Oxide Semiconductor>

In all of the embodiments described above, oxide semiconductor TFTs may be used as the depression-type TFTs.

Figure 12:
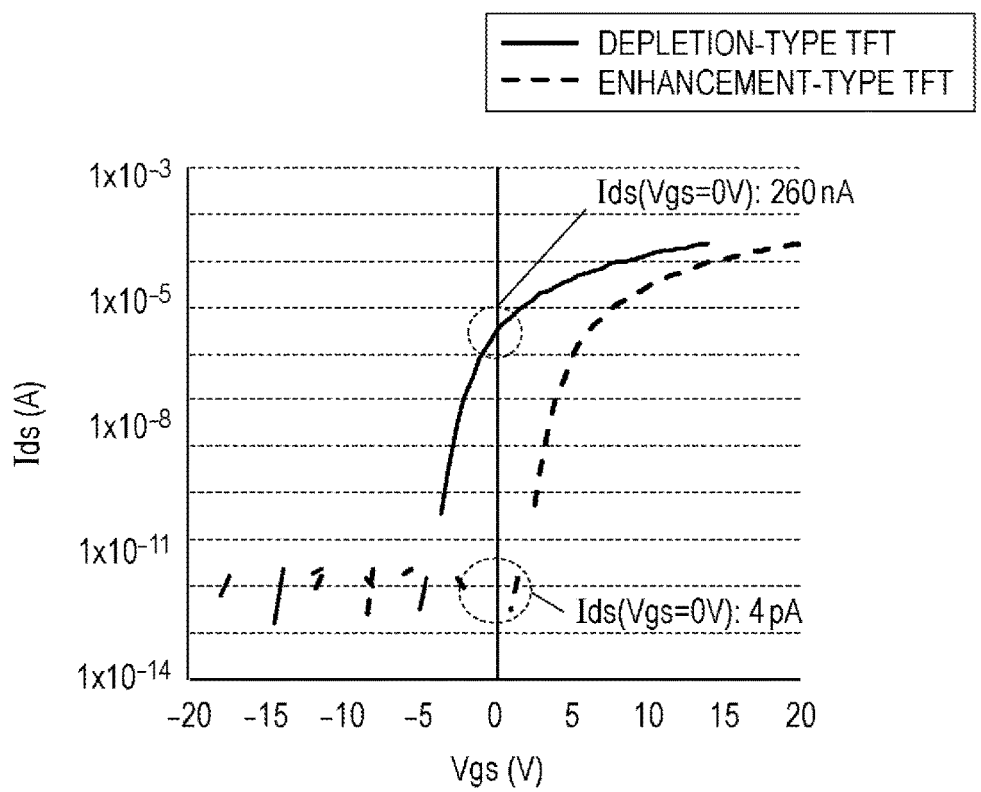
FIG. 12 is a diagram illustrating current-voltage characteristics of an enhancement-type oxide semiconductor TFT and a depression-type oxide semiconductor TFT.

As described above with reference to FIG. 12, when a depression-type oxide semiconductor TFT is used, since it is possible to increase the leakage current when the gate voltage Vgs is 0 V, it is possible to rapidly discharge the charges on the floating nodes in the circuit. Accordingly, when a node potential holding circuit is provided in a shift register circuit including a depression-type oxide semiconductor TFT, it is possible to suppress charge unevenness due to floating charges, and at the same time, it is possible to suppress deterioration of circuit output characteristics caused by leakage current of the depression-type oxide semiconductor TFTs, which is advantageous. For example, in an active matrix substrate using depression-type oxide semiconductor TFTs as pixel TFTs and circuit TFTs, a node potential holding circuit may be provided in part of the circuit. TFTs forming the drive circuit.

The oxide semiconductor included in the oxide semiconductor layer of the oxide semiconductor TFT may be an amorphous oxide semiconductor or may be a crystalline oxide semiconductor having a crystalline portion. Examples of crystalline oxide semiconductors include a polycrystalline oxide semiconductor, a microcrystalline oxide semiconductor, a crystalline oxide semiconductor in which the c-axis is oriented substantially perpendicularly to the layer surface, and the like.

The oxide semiconductor layer may have a laminated structure with two or more layers. In a case where the oxide semiconductor layer has a laminated structure, the oxide semiconductor layer may include an amorphous oxide semiconductor layer and a crystalline oxide semiconductor layer. Alternatively, a plurality of crystalline oxide semiconductor layers having different crystal structures may be included. In addition, a plurality of amorphous oxide semiconductor layers may be included. In a case where the oxide semiconductor layer has a two-layer structure including an upper layer and a lower layer, the energy gap of the oxide semiconductor included in the upper layer is preferably larger than the energy gap of the oxide semiconductor included in the lower layer. However, in a case where the difference in energy gap between these layers is comparatively small, the energy gap of the lower layer oxide semiconductor may be larger than the energy gap of the upper layer oxide semiconductor.

For the amorphous oxide semiconductor and each of the crystalline oxide semiconductors described above, the material, structure, film formation method, configuration of an oxide semiconductor layer having a laminated structure, and the like are described in, for example, Japanese Unexamined Patent Application Publication No. 2014-007399. All the invention content of Japanese Unexamined Patent Application Publication No. 2014-007399 is incorporated here in by reference.

The oxide semiconductor layer may include, for example, at least one type of metal element selected from In, Ga, and Zn. In the present embodiment, the oxide semiconductor layer includes, for example, an In—Ga—Zn—O-based semiconductor (for example, indium gallium zinc oxide Here, the In—Ga—Zn—O-based semiconductor is a ternary oxide of In (indium), Ga (gallium), Zn (zinc), and the ratio (composition ratio) of In, Ga and Zn is not particularly limited and includes, for example, In:Ga:Zn=2:2:1, In:Ga:Zn=1:1:1, In:Ga:Zn=1:1:2, and the like. It is possible to form such an oxide semiconductor layer from an oxide semiconductor film including an In—Ga—Zn—O-based semiconductor.

The In—Ga—Zn—O-based semiconductor may be amorphous or crystalline. As a crystalline In—Ga—Zn—O-based semiconductor, a crystalline In—Ga—Zn—O-based semiconductor in which the c-axis is oriented substantially perpendicularly to the layer surface is preferable.

The crystal structure of a crystalline In—Ga—Zn—O-based semiconductor is disclosed in, for example, Japanese Unexamined Patent Application Publication No. 2014-007399, Japanese Unexamined Patent Application Publication No. 2012-134475, and Japanese Unexamined Patent Application Publication. No. 2014-209727 described above, and the like. The entire disclosed contents of Japanese Unexamined Patent Application Publication No. 2012-134475 and Japanese Unexamined Patent Application Publication No. 2014-209727 are incorporated in the present specification by reference. Since a TFT having an In—Ga—Zn—O-based semiconductor layer has high mobility (more than 20 times as compared with an a-Si TFT) and low leakage current (less than 1/100th compared to an a-Si TFT), it is possible to preferably use the TFT as a driving TFT (for example, a TFT included in a drive circuit provided on the same substrate as a display region, in the periphery of a display region including a plurality of pixels) and a pixel TFT (TFT provided in a pixel).

Instead of the In—Ga—Zn—O-based semiconductor, the oxide semiconductor layer may include another oxide semiconductor. For example, an In—Sn—Zn—O-based semiconductor (for example, $In_2O_3$—$SnO_2$—ZnO; InSnZnO) may be included. The In—Sn—Zn—O-based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, and the like.

<Structure of Depression-Type TFT>

The structure of the depression-type TFTs to be used in the embodiment described above is not particularly limited. A bottom gate structure in which a gate electrode is arranged between a semiconductor layer and a substrate may be used or a top gate structure in which a gate electrode is arranged above a semiconductor layer may be used. In addition, the source and drain electrodes may be in contact with the top surface of the semiconductor layer (top contact structure) or may be in contact with the bottom surface of the semiconductor layer (bottom contact structure).

In a case of using a TFT having a top contact structure, the TFT may have a channel-etched structure or may have an etch stop structure. An etch stop type TFT has an etch stop layer so as to come in contact with the upper surface of a channel region of a semiconductor layer (for example, an oxide semiconductor layer). The lower surface of the end portion on the channel side of the source and drain electrodes is positioned, for example, on the etch stop layer. An etch stop type TFT is formed by, for example, forming an etch stop layer covering a portion to be a channel region in a semiconductor layer and then forming a conductive film for a source and drain electrode on the semiconductor layer and the etch stop layer, and carrying out source and drain separation. On the other hand, in the channel etch type TFT, an etch stop layer is not formed on the channel region, and the lower surface of the end portion on the channel side of the source and drain electrodes is arranged so as to be in contact with the upper surface of the oxide semiconductor layer. The channel etch type TFT is formed, for example, by forming a conductive film for a source and drain electrode on an oxide semiconductor layer and carrying out source and drain separation. In the source and drain separation step, the surface portion of the channel region may be etched.

The TFT circuits of the first to third embodiments described above may be shift register circuits or unit circuits (bistable circuits) forming shift register circuits. It is possible to suitably apply such a circuit to, for example, a monolithic gate driver or an active matrix substrate or a display apparatus provided with a monolithic gate driver. Here, the first to third embodiments are not limited to the shift register circuit and are able to be applied to various circuits including depression-type TFTs.

INDUSTRIAL APPLICABILITY

Embodiments of the present invention are able to be widely applied to various circuits including depression-type TFTs. For example, application is possible to a drive circuit such as a gate driver. In particular, suitable application is possible to a monolithic gate driver in an active matrix substrate. Active matrix substrates are applied to display apparatuses such as a liquid crystal display apparatus, an organic electroluminescence (EL) display apparatus, and an inorganic electroluminescence display apparatus, an imaging apparatus such as an image sensor apparatus, and various electronic apparatuses such as an image input apparatus, a fingerprint reading apparatus, and semiconductor memories.

REFERENCE SIGNS LIST

11: LOW-POTENTIAL WIRING
21, 22, 23, 31 to 35, 40 to 49: DEPRESSION-TYPE TFT
51, 55: PUSH-DOWN CIRCUIT
53, 57, CAP: CAPACITOR
101, 102, 103, 201, 202: TFT CIRCUIT
CLK1, CLK2, CLK3, CLK4: CLOCK SIGNAL
CLR: CLEAR SIGNAL
COM: COMMON POTENTIAL
GOUT: OUTPUT SIGNAL
GSA: GATE START PULSE SIGNAL
N1: FIRST NODE
N2: SECOND NODE
netA to netF, $N_{GOUT}$: NODE
RESET: RESET SIGNAL
SC1, SC2: SUB-CIRCUIT
SET: SET SIGNAL
SRk: UNIT CIRCUIT
Va, Vb, Vc: LOW POTENTIAL

The invention claimed is:

1. A TFT circuit comprising:
a first node to which a first low potential Vc is supplied; and
a depression-type first TFT which is arranged between the first node and low-potential wiring for supplying a second low potential Va higher than the first low potential Vc, and in which a drain terminal is connected to the first node,
wherein the TFT circuit further includes a depression-type second TFT which is arranged between the first TFT and the low-potential wiring and in which a source terminal is connected to a source terminal of the first TFT,
the first low potential Vc is supplied to a gate terminal of the second TFT,
a second node enterable a floating state is formed between the source terminal of the first TFT and the source terminal of the second TFT, and
the second node is connected to a sub-circuit which is settable a potential of the second node to be lower than the second low potential Va and higher than the first low potential Vc.

2. The TFT circuit according to claim 1,
wherein the sub-circuit includes the second TFT and a depression-type third TFT,
a source terminal of the third TFT is connected to the second node,
the first low potential Vc is supplied to a gate terminal of the third TFT, and
a drain terminal of the third TFT is connected to other low-potential wiring which supplies the first low potential Vc.

3. The TFT circuit according to claim 1,
wherein the sub-circuit supplies a third low potential Vb which is lower than the second low potential Va and higher than the first low potential Vc to the second node, thereby the potential of the second node being set to be lower than the third low potential Vb and higher than the first low potential Vc.

4. The TFT circuit according to claim 3, further comprising:
a first push-down circuit for pushing down the potential of the second node n times using a plurality of signals to be input to the TFT circuit; and a second push-down circuit for pushing down a potential of the gate terminal of the second TFT m times, which is more than n times, using a plurality of signals to be input to the TFT circuit, wherein the sub-circuit includes the first push-down circuit.

5. The TFT circuit according to claim 1, the TFT circuit being a bistable circuit forming a shift register, comprising:
an output terminal for outputting an output signal;
an output transistor in which a source or drain terminal is connected to the output terminal;
a node netA connected to a gate terminal of the output transistor;
a pull-down transistor for lowering a potential of the node netA; and
a node netB connected to a gate terminal of the pull-down transistor,
wherein the first node is the node netA and the first TFT is the pull-down transistor.

6. The TFT circuit according to claim 1, the TFT circuit being a bistable circuit forming a shift register, comprising:
an output terminal for outputting an output signal;
an output transistor in which a source or drain terminal is connected to the output terminal;
a node netA connected to a gate terminal of the output transistor;
a pull-down transistor for lowering a potential of the node netA; and
a node netB connected to a gate terminal of the pull-down transistor,
wherein the first node is the node netB.

7. The TFT circuit according to claim 1, the TFT circuit being a bistable circuit forming a shift register, comprising:
an output terminal for outputting an output signal;
a node GOUT connected to the output terminal;
an output transistor in which a source or drain terminal is connected to the output terminal;
a node netA connected to a gate terminal of the output transistor;
a pull-down transistor for lowering a potential of the node netA; and
a node netB connected to a gate terminal of the pull-down transistor,
wherein the first node is the node GOUT.

8. The TFT circuit according to claim 1, wherein the first TFT and the second TFT are oxide semiconductor TFTs.

9. A shift register circuit comprising:
the TFT circuit according to claim 1.

* * * * *